(12) United States Patent
Zhang et al.

(10) Patent No.: US 11,665,815 B2
(45) Date of Patent: May 30, 2023

(54) LENS MODULE OF REDUCED SIZE AND ELECTRONIC DEVICE

(71) Applicant: TRIPLE WIN TECHNOLOGY(SHENZHEN) CO. LTD., Shenzhen (CN)

(72) Inventors: Long-Fei Zhang, Guangdong (CN); Jian-Chao Song, Guangdong (CN); Jing-Wei Li, Guangdong (CN); Sheng-Jie Ding, Guangdong (CN); Shin-Wen Chen, New Taipei (TW); Ding-Nan Huang, New Taipei (TW)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 17/530,695

(22) Filed: Nov. 19, 2021

(65) Prior Publication Data

US 2022/0304145 A1    Sep. 22, 2022

(30) Foreign Application Priority Data

Mar. 17, 2021  (CN) .......................... 202110285420.9

(51) Int. Cl.
*G02B 7/02*  (2021.01)
*H05K 1/02*  (2006.01)
(Continued)

(52) U.S. Cl.
CPC ........... *H05K 1/0271* (2013.01); *G02B 7/025* (2013.01); *H04M 1/0264* (2013.01);
(Continued)

(58) Field of Classification Search
CPC ...... H05K 1/0271; H05K 1/115; H05K 1/181; H05K 3/4691; H05K 2201/10121; G02B 7/02; G02B 7/025; H04M 1/0264
See application file for complete search history.

(56) References Cited

U.S. PATENT DOCUMENTS

2007/0160369 A1    7/2007   Jane
2008/0246845 A1*  10/2008   Chan .................... H04N 23/55
                                                   348/207.2
(Continued)

FOREIGN PATENT DOCUMENTS

CN    103780805 A    5/2014
CN    104917944 A    9/2015

OTHER PUBLICATIONS

English Translation CN 104917944, Published Sep. 16, 2015 (Year: 2015).*

*Primary Examiner* — Steven T Sawyer
(74) *Attorney, Agent, or Firm* — ScienBiziP, P.C.

(57) ABSTRACT

A lens module of reduced size includes a circuit board, a mounting base, and electronic components. The mounting base is disposed on the circuit board, and includes a base plate and a first flange surrounding edges of the base plate. A portion of the bottom surface of the base plate includes a first area, a second area, a third area, and a fourth area. The first flange includes a first flange portion disposed on the first area and a second flange portion disposed on the second area. The electronic components are disposed on the circuit board, and disposed under at least one of the third area and the fourth area.

16 Claims, 7 Drawing Sheets

(51) Int. Cl.
  *H05K 1/11*  (2006.01)
  *H05K 1/18*  (2006.01)
  *H04M 1/02*  (2006.01)

(52) U.S. Cl.
  CPC ............ *H05K 1/115* (2013.01); *H05K 1/181* (2013.01); *G02B 7/02* (2013.01); *H05K 2201/10121* (2013.01)

(56) References Cited

U.S. PATENT DOCUMENTS

| | | | |
|---|---|---|---|
| 2008/0297645 A1* | 12/2008 | Lo ......................... | H04N 23/57 438/69 |
| 2009/0033789 A1* | 2/2009 | Lin ......................... | G02B 7/02 348/374 |
| 2017/0244872 A1* | 8/2017 | Wang ..................... | H04N 23/51 |
| 2017/0353646 A1* | 12/2017 | Wang ..................... | H05K 1/182 |
| 2020/0064583 A1* | 2/2020 | Ding ...................... | G02B 7/006 |
| 2020/0077517 A1* | 3/2020 | Li ........................... | H05K 1/0306 |
| 2020/0209441 A1* | 7/2020 | Chen ...................... | H04N 23/55 |
| 2022/0304145 A1* | 9/2022 | Zhang ................... | H05K 1/0271 |

* cited by examiner

LENS MODULE OF REDUCED SIZE AND ELECTRONIC DEVICE

FIELD

The subject matter relates to imaging devices, and more particularly, to a lens module and an electronic device having the lens module.

BACKGROUND

Portable electronic devices, such as cell phones, tablet computers, and multimedia players, usually include lens modules. With the development of the electronic devices, and particularly with the increase of resolution and size of screen, demands for the decrease of internal electronic components (such as the lens module) are raised. Therefore, there is room for improvement in the art.

BRIEF DESCRIPTION OF THE DRAWINGS

Implementations of the present technology will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
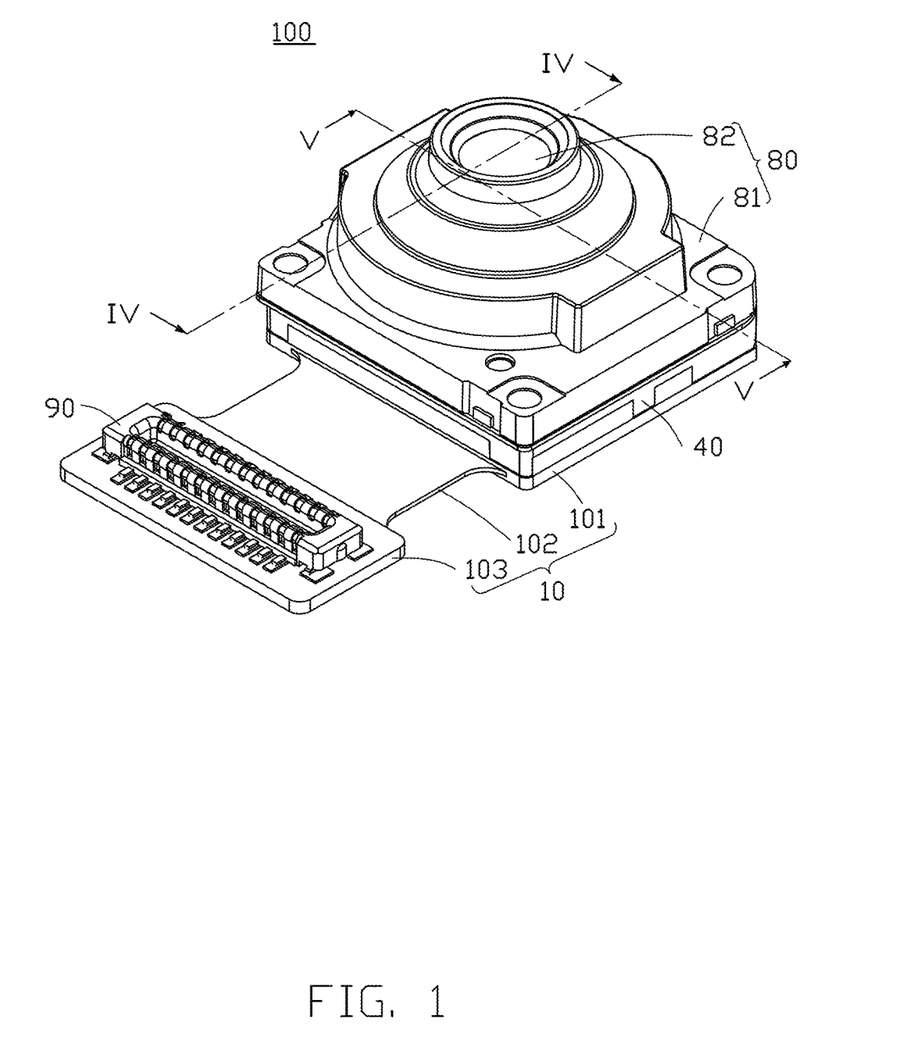
FIG. 1 is a diagrammatic view of an embodiment of a lens module according to the present disclosure.
Figure 3:
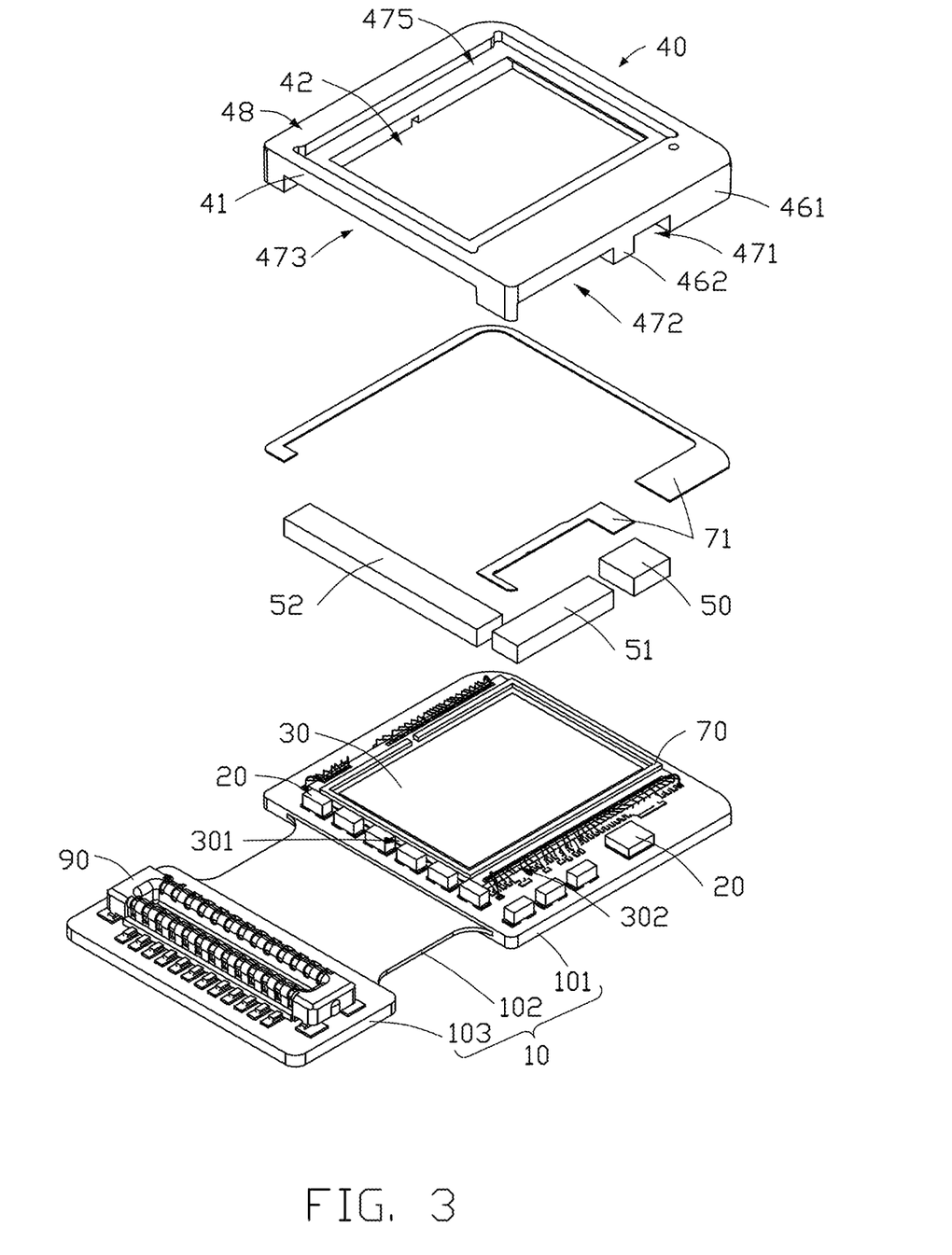
FIG. 3 is a partially exploded view of the lens module of FIG. 1.

Referring to FIGS. 1 and 3, an embodiment of a lens module 100 is provided, which includes a circuit board 10, a number of electronic components 20, a photosensitive chip 30, a mounting base 40, an optical filter 60, and a lens assembly 80. The electronic components 20 are disposed on the circuit board 10 and surround the photosensitive chip 30. The mounting base 40 is disposed on the circuit board 10, and the photosensitive chip 30 and the electronic components 20 are received in the mounting base 40. The lens assembly 80 is disposed on a surface of the mounting base 40 away from the circuit board 10. The optical filter 60 is received in the mounting base 40, and between the photosensitive chip 30 and the lens assembly 80.

The circuit board 10 includes a first board portion 101, a second board portion 102, and a third board portion 103. The second board portion 102 is connected between the first board portion 101 and the third board portion 103. The electronic components 20 and the photosensitive chip 30 are mounted on the first board portion 101. The circuit board 10 can be a flexible circuit board, a rigid circuit board, or a flexible-rigid circuit board. In the embodiment, the circuit board 10 is a flexible-rigid circuit board. Each of the first board portion 101 and the third board portion 103 is rigid, and the second board portion 102 is flexible. The circuit board 10 further includes an electrical connection portion 90 mounted on the third board portion 103. The electrical connection portion 90 may be a connector or gold fingers, which can transmit signals between the lens module 100 and other electronic components (not shown) in an electronic device (e.g., an electronic device 200 in FIG. 7).

Figure 2:
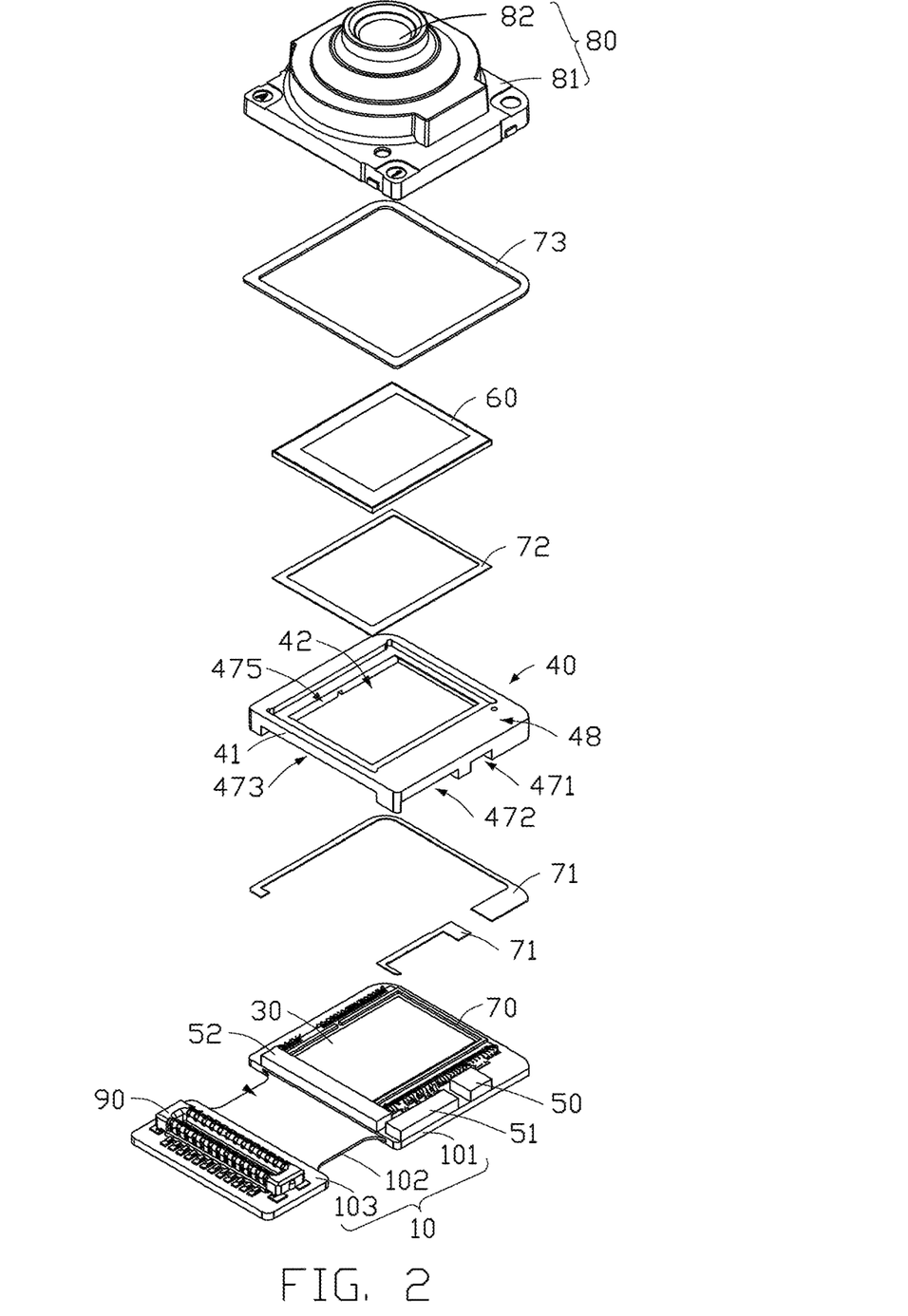
FIG. 2 is an exploded view of the lens module of FIG. 1.

Referring to FIGS. 2 and 3, the photosensitive chip 30 has a first edge 301 and a second edge 302 connected to the first edge 301. The first edge 301 is close to the interconnection between the first board portion 101 and the second board portion 102. A portion of the electronic components 20 can be close to the first edge 301, and a remaining portion of the electronic components 20 can be close to the second edge 302. Each of the electronic components 20 may be a passive component such as resistance, capacitance, diode, triode, relay, and electrically Erasable programmable read only memory (EEPROM).

Figure 4:
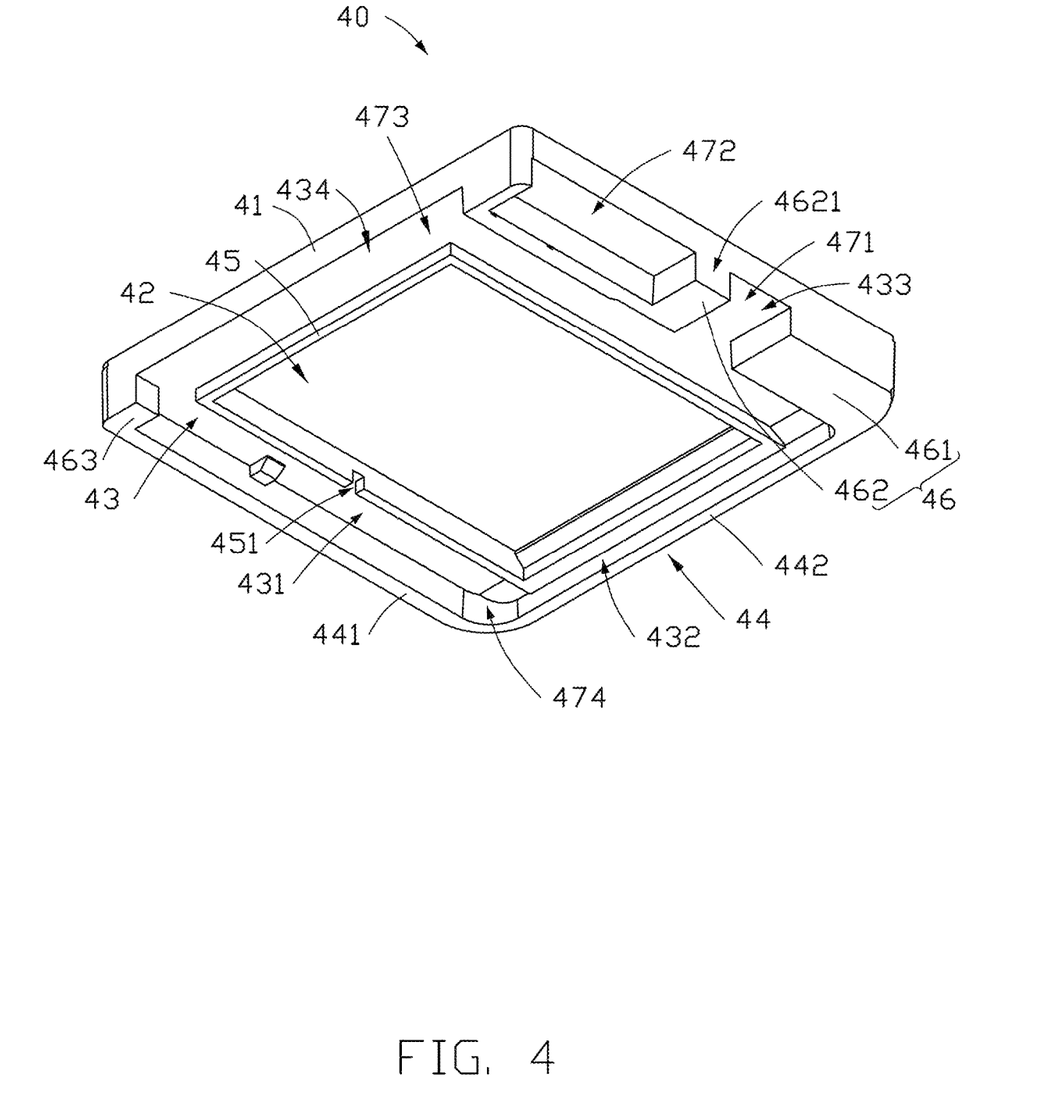
FIG. 4 is a diagrammatic view of a mounting base of FIG. 3.
Figure 5:
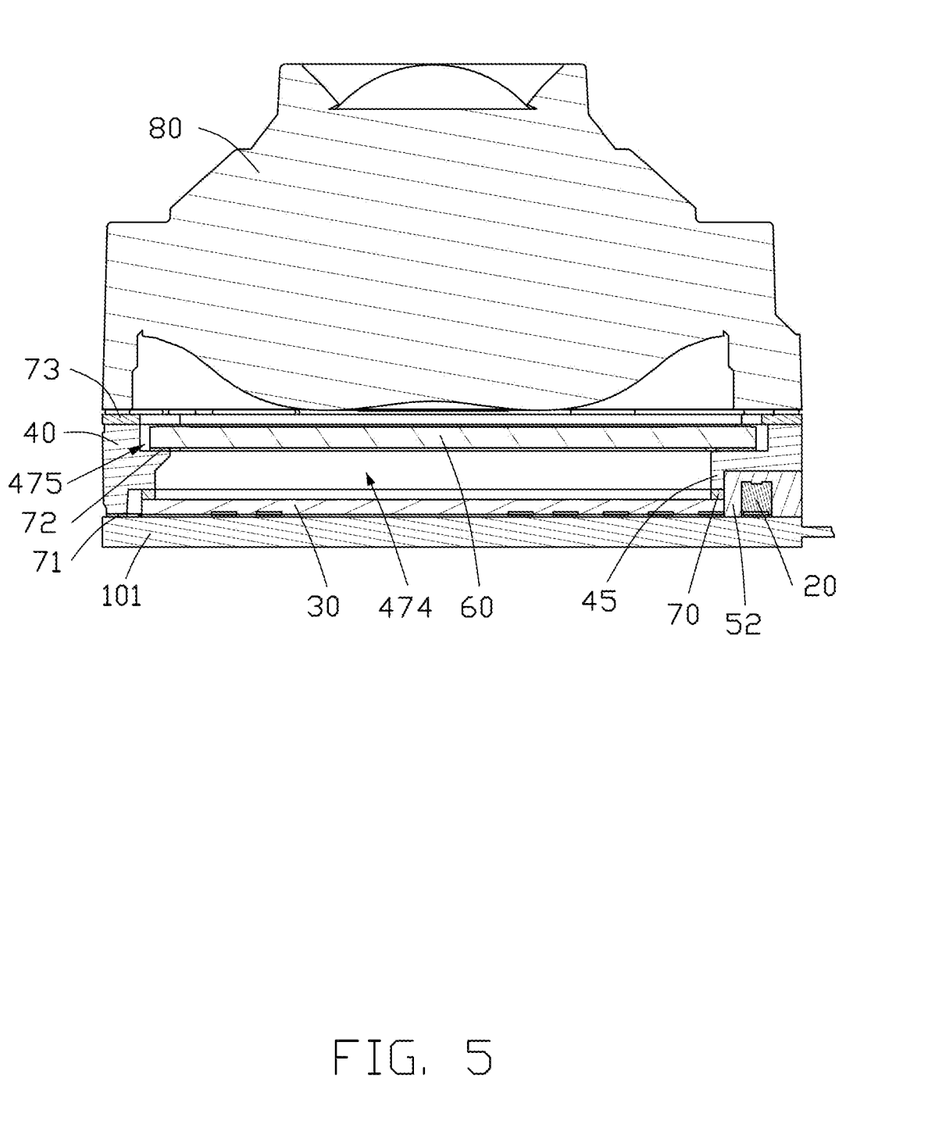
FIG. 5 is a cross-sectional view along IV-IV of FIG. 1.
Figure 6:
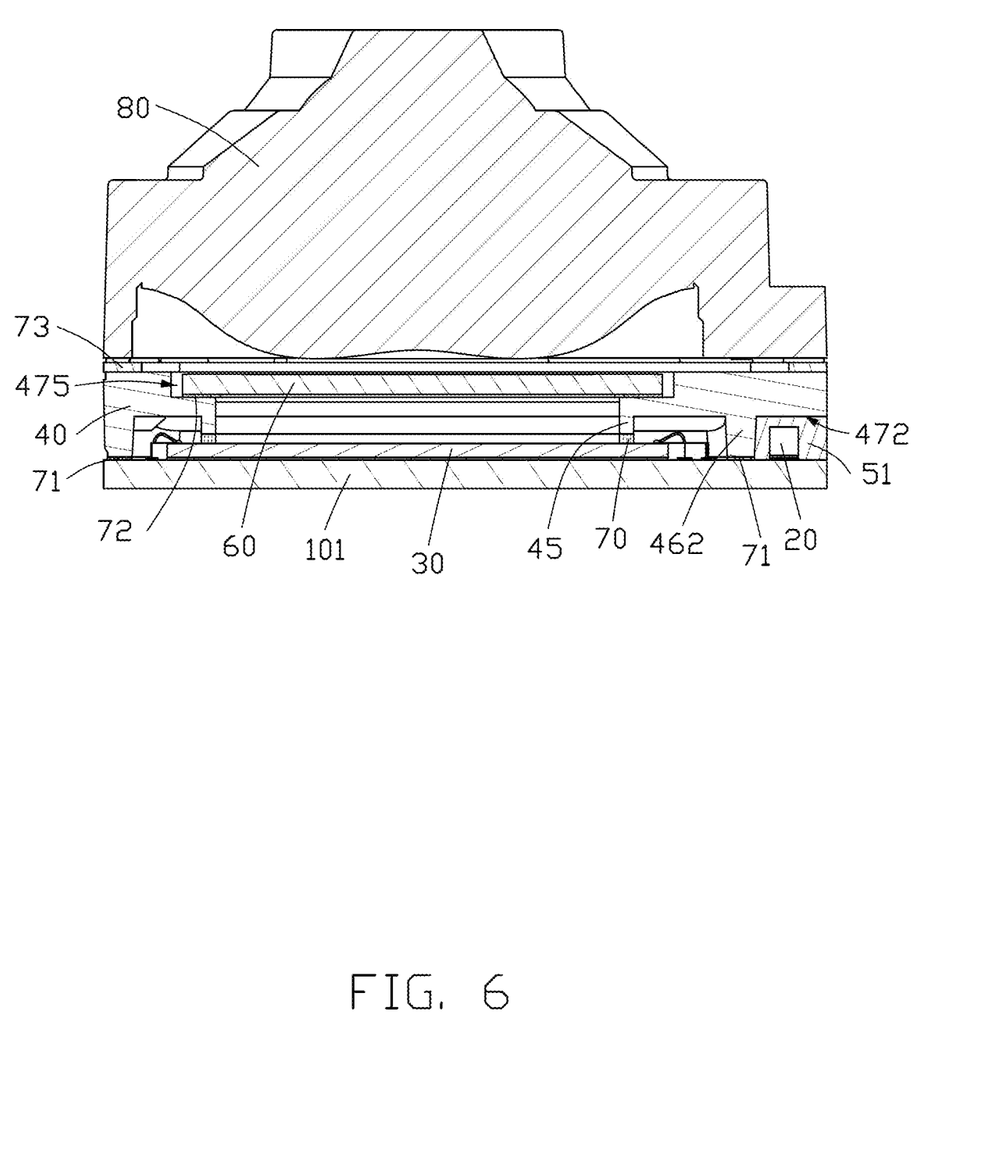
FIG. 6 is a cross-sectional view along V-V in an embodiment of FIG. 1.

Referring to FIGS. 3 and 4, the mounting base 40 includes a base plate 41 and a first flange 44 surrounding edges of the base plate 41. The first flange 44 is disposed between the base plate 41 and the circuit board 10. The base plate 41 includes a top surface 48 and a bottom surface 43 opposite to the top surface 48. The bottom surface 43 faces the circuit board 10. The base plate 41 further defines a through hole 42 passing through the bottom surface 43. The photosensitive chip 30 corresponds to the through hole 42. A portion of the bottom surface 43 away from the through hole 42 has a first area 431, a second area 432, a third area 433, and a fourth area 434 connected in that order. The second area 432 is away from the intersection of the first board portion 101 and the second board portion 102. The fourth area 434 is close to the intersection of the first board portion 101 and the second board portion 102. The first flange 44 includes a first flange portion 441 and a second flange portion 442 connected to the first flange portion 441. The first flange portion 441 is disposed on the first area 431, and the second flange portion 442 is disposed on the second area 432. The first flange portion 441 and the second flange portion 442 have a same height. The fourth area 434 corresponds to the first edge 301 of the photosensitive chip 30. The electronic components 20 at the first edge 301 of the photosensitive chip 30 are disposed under the fourth area 434.

Since the mounting base 40 has no flange on the third area 433, the mounting base 40 has no need to avoid the electronic components 20 at the first edge 301 of the photosensitive chip 30. Therefore, the distance between the second area 432 and the fourth area 434 can be reduced. That is, the overall transverse size of the mounting base 40 can be reduced.

In order to improve the mechanical strength of the mounting base 40, in one embodiment, the mounting base 40 also includes a reinforcing block 46 disposed on the third area 433. The reinforcing block 46 includes a first block 461 and a second block 462. The first block 461 is connected to the second flange portion 442. The second block 462 is disposed on the intersection of the third area 433 and the fourth area 434. A first receiving groove 471 is defined between the first block 461 and the second block 462. The second block 462 has an outer side 4621 away from the first area 431. The outer side 4621 is concaved towards the center of the through hole 42 to form a second receiving groove 472. The electronic components 20 close to the second edge 302 of the photosensitive chip 30 are disposed in the first receiving groove 471 and the second receiving groove 472.

Referring to FIGS. 3 and 4, the mounting base 40 further includes a third block 463 at the intersection of the first area 431 and the fourth area 434. A third receiving groove 473 is defined between the third block 463 and the second block 462. The electronic components 20 close to the first edge 301 of the photosensitive chip 30 are received in the third receiving groove 473.

Referring to FIGS. 3 to 6, a first rubber block 50 is disposed on the first receiving groove 471, a second rubber block 51 is disposed on the second receiving groove 472, and a third rubber block 52 is disposed on the third receiving groove 473. The first rubber block 50, the second rubber block 51, and the third rubber block 52 wrap on the electronic components 20, and infill the first receiving groove 471, the second receiving groove 472, and the third receiving groove 473, respectively. The first rubber block 50, the second rubber block 51, and the third rubber block 52 can be made of opaque materials, which can prevent light leakage at the edge of the photosensitive chip 30, and also protect the electronic components 20 when the lens module 100 falls down.

Referring to FIGS. 3 and 4, the base plate 41 and the first flange 44 cooperatively define a fourth receiving groove 474 for receiving the photosensitive chip 30. The fourth receiving groove 474 communicates with the through hole 42. A portion of the bottom surface 43 adjacent to the through hole 42 extends toward the circuit board 10 to form a second flange 45. The height of the second flange 45 is less than the height of the first flange portion 441. The photosensitive chip 30 is fixed between the second flange 45 and the circuit board 10.

Referring to FIGS. 3 and 4, in at least one embodiment, a first adhesive layer 70 is disposed on a surface of the second flange 45 facing the circuit board 10. The first adhesive layer 70 is used to fix the photosensitive chip 30 on the second flange 45, and the gap between the second flange 45 and the photosensitive chip 30 are sealed to prevent external light from entering the photosensitive chip 30 through the gap. In actual production, the second flange 45 defines a notch 451. When adhesive is baked to form the first adhesive layer 70, the gas inside the mounting base 40 can exit the mounting base 40 through the notch 451, so as to avoid bubbles in the first adhesive layer 70 and improve the sealing effect between the second flange 45 and the photosensitive chip 30.

Referring to FIGS. 2 and 3, the top surface 48 is recessed towards the bottom surface 43 to form a fifth receiving groove 475, and the through hole 42 is located at the bottom of the fifth receiving groove 475. The optical filter 60 is received in the fifth receiving groove 475.

Referring to FIG. 2, the lens module 100 also includes a second adhesive layer 71, a third adhesive layer 72, and a fourth adhesive layer 73. The second adhesive layer 71 is disposed between the circuit board 10 and the mounting base 40, for fixing the mounting base 40 to the circuit board 10. The third adhesive layer 72 is disposed between the optical filter 60 and the bottom surface of the fifth receiving groove 475, for fixing the optical filter 60 to the mounting base 40. The fourth adhesive layer 73 is disposed between the mounting base 40 and the lens assembly 80, for fixing the lens assembly 80 to the mounting base 40.

Referring to FIGS. 1 and 2, the lens assembly 80 includes a lens base 81 and a lens barrel 82. The lens base 81 is disposed on the top surface 48 of the mounting base 40 by the fourth adhesive layer 73. The lens barrel 82 is disposed in the lens base 81. In the embodiment, the cross-sectional view of each of the lens base 81 and the mounting base 40 is substantially square.

Figure 7:
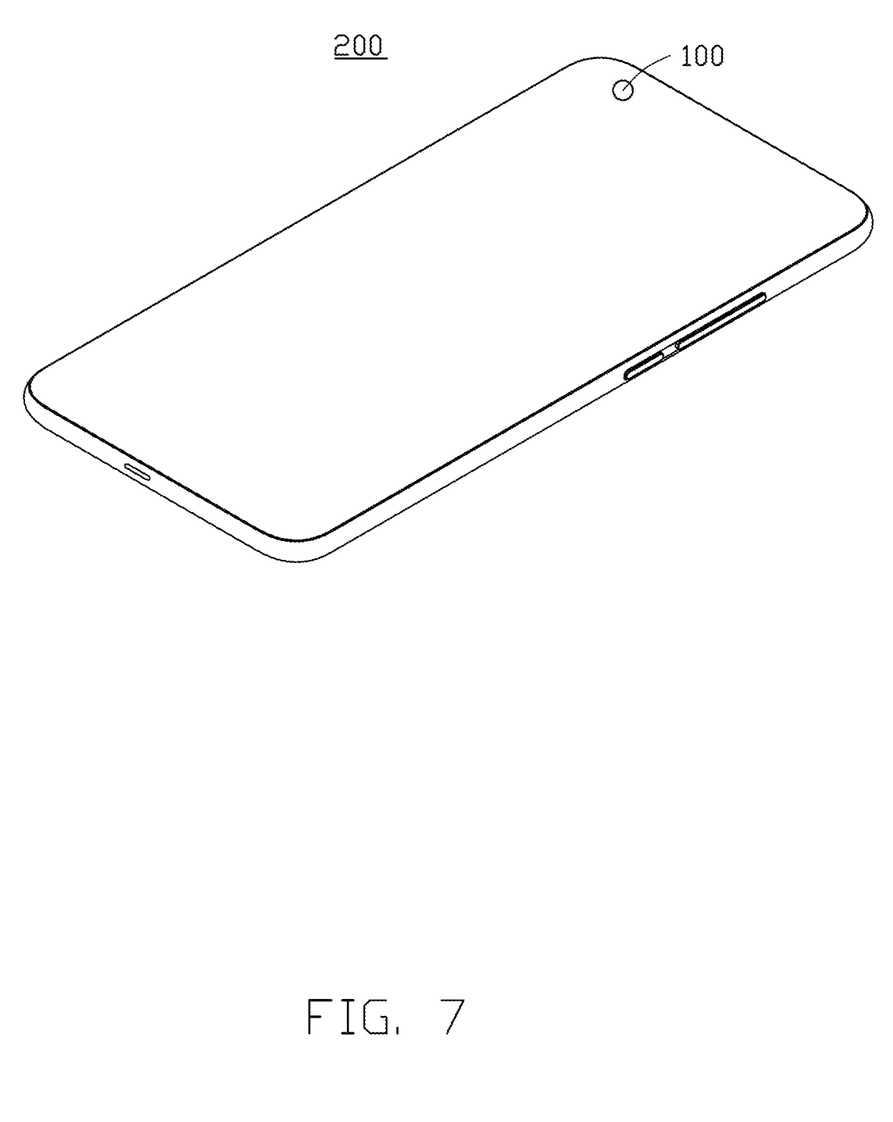
FIG. 7 is a diagrammatic view of an embodiment of an electronic device according to the present disclosure.

Referring to FIG. 7, an embodiment of an electronic device 200 is further provided, which includes the lens module 100. The electronic device 200 can be a mobile phone, a wearable device, a vehicle, a camera, or a monitoring device.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A lens module, comprising:
    a circuit board;
    a mounting base disposed on the circuit board, the mounting base comprising a base plate and a first flange, the first flange surrounding edges of the base plate and disposed between the base plate and the circuit board, the base plate comprising a bottom surface facing the circuit board, the base plate defining a through hole passing through the bottom surface, a portion of the bottom surface away from the through hole comprising a first area, a second area, a third area, and a fourth area connected in that order, the first flange comprising a first flange portion disposed on the first area and a second flange portion disposed on the second area;
    a plurality of electronic components disposed on the circuit board, and disposed under at least one of the third area and the fourth area; and
    a photosensitive chip disposed on the circuit board and corresponding to the through hole, wherein the mounting base further comprises a second flange extending from another portion of the bottom surface adjacent to the through hole towards the circuit board, a first adhesive layer is disposed between the second flange and the photosensitive chip to fix the photosensitive chip on the second flange.

2. The lens module of claim 1, wherein the mounting base further comprises a reinforcing block disposed on the third area.

3. The lens module of claim 2, wherein the reinforcing block comprises a first block and a second block, the first block is connected to the second flange portion, the second block is disposed on an intersection of the third area and the fourth area, a first receiving groove is defined between the first block and the second block, and a portion of the plurality of electronic components is disposed in the first receiving groove.

4. The lens module of claim 3, wherein the second block has an outer side away from the first area, the outer side is concaved towards a center axis of the through hole to form a second receiving groove, and another portion of the plurality of electronic components is disposed in the second receiving groove.

5. The lens module of claim 4, wherein the mounting base further defines a third block at an intersection of the first area and the fourth area, a third receiving groove is defined between the third block and the second block, and a remaining portion of the plurality of electronic components is disposed in the third receiving groove.

6. The lens module of claim 5, wherein a first rubber block is disposed in the first receiving groove, a second rubber block is disposed in the second receiving groove, a third rubber block is disposed in the third receiving groove, and the first rubber block, the second rubber block, and the third rubber block wrap the plurality of electronic components.

7. The lens module of claim 1, wherein the second flange has a notch.

8. The lens module of claim 1, wherein a height of the first flange portion is equal to a height of the second flange portion, and a height of the second flange is less than the height of the first flange portion.

9. An electronic device, comprising:
a lens module, comprising:
  a circuit board;
  a mounting base disposed on the circuit board, the mounting base comprising a base plate and a first flange, the first flange surrounding edges of the base plate and disposed between the base plate and the circuit board, the base plate comprising a bottom surface facing the circuit board, the base plate defining a through hole passing through the bottom surface, a portion of the bottom surface away from the through hole comprising a first area, a second area, a third area, and a fourth area connected in that order, the first flange comprising a first flange portion disposed on the first area and a second flange portion disposed on the second area;
a plurality of electronic components disposed on the circuit board, and disposed under at least one of the third area and the fourth area; and
a photosensitive chip disposed on the circuit board and corresponding to the through hole, wherein the mounting base further comprises a second flange extending from another portion of the bottom surface adjacent to the through hole towards the circuit board, a first adhesive layer is disposed between the second flange and the photosensitive chip to fix the photosensitive chip on the second flange.

10. The electronic device of claim 9, wherein the mounting base further comprises a reinforcing block disposed on the third area.

11. The electronic device of claim 10, wherein the reinforcing block comprises a first block and a second block, the first block is connected to the second flange portion, the second block is disposed on an intersection of the third area and the fourth area, a first receiving groove is defined between the first block and the second block, and a portion of the plurality of electronic components is disposed in the first receiving groove.

12. The electronic device of claim 11, wherein the second block has an outer side away from the first area, the outer side is concaved towards a center axis of the through hole to form a second receiving groove, and another portion of the plurality of electronic components is disposed in the second receiving groove.

13. The electronic device of claim 12, wherein the mounting base further defines a third block at an intersection of the first area and the fourth area, a third receiving groove is defined between the third block and the second block, and a remaining portion of the plurality of electronic components is disposed in the third receiving groove.

14. The electronic device of claim 13, wherein a first rubber block is disposed in the first receiving groove, a second rubber block is disposed in the second receiving groove, a third rubber block is disposed in the third receiving groove, and the first rubber block, the second rubber block, and the third rubber block wrap the plurality of electronic components.

15. The electronic device of claim 9, wherein the second flange has a notch.

16. The electronic device of claim 9, wherein a height of the first flange portion is equal to a height of the second flange portion, and a height of the second flange is less than the height of the first flange portion.

* * * * *